United States Patent
Smith et al.

(10) Patent No.: US 6,794,581 B2
(45) Date of Patent: Sep. 21, 2004

(54) METHOD AND APPARATUS FOR DISTRIBUTING POWER TO INTEGRATED CIRCUITS

(75) Inventors: Larry D. Smith, San Jose, CA (US); Istvan Novak, Maynard, MA (US); Michael C. Freda, Morgan Hill, CA (US); Ali Hassanzadeh, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/809,837

(22) Filed: Mar. 16, 2001

(65) Prior Publication Data

US 2002/0129974 A1 Sep. 19, 2002

Related U.S. Application Data

(60) Provisional application No. 60/244,397, filed on Oct. 30, 2000.

(51) Int. Cl.[7] ................................................. H05K 1/16
(52) U.S. Cl. ........................ 174/260; 174/261; 29/830
(58) Field of Search ........................... 29/830, 832, 840; 361/780, 744, 792–795; 174/260, 261–266; 439/65–75; 257/700

(56) References Cited

U.S. PATENT DOCUMENTS

| | | | |
|---|---|---|---|
| 3,626,081 A | | 12/1971 | Little |
| 3,670,208 A | | 6/1972 | Hovanian et al. |
| 4,628,411 A | | 12/1986 | Balderes et al. |
| 5,077,639 A | | 12/1991 | Haller et al. |
| 5,079,069 A | | 1/1992 | Howard et al. |
| 5,235,211 A | * | 8/1993 | Hamburgen ................ 257/758 |
| 5,261,153 A | | 11/1993 | Lucas |
| 5,480,309 A | | 1/1996 | Arisaka |
| 5,574,630 A | * | 11/1996 | Kresge et al. ............... 361/792 |
| 5,691,041 A | | 11/1997 | Frankeny et al. |
| 5,694,297 A | | 12/1997 | Smith et al. |
| 5,847,936 A | * | 12/1998 | Forehand et al. ............ 361/794 |
| 5,854,534 A | * | 12/1998 | Beilin et al. ................. 257/691 |
| 5,870,274 A | | 2/1999 | Lucas |
| 6,075,285 A | * | 6/2000 | Taylor et al. ................ 257/691 |
| 6,081,026 A | * | 6/2000 | Wang et al. ................. 257/700 |
| 6,175,509 B1 | | 1/2001 | Koch |
| 6,239,485 B1 | * | 5/2001 | Peters et al. ................. 257/700 |
| 6,351,393 B1 | * | 2/2002 | Kresge et al. ............... 174/252 |
| 6,373,717 B1 | * | 4/2002 | Downes, Jr. et al. ........ 174/255 |

FOREIGN PATENT DOCUMENTS

| | | |
|---|---|---|
| DE | 1246836 | 8/1967 |
| JP | 04118984 | 4/1992 |
| JP | 10321979 | 12/1998 |

OTHER PUBLICATIONS

International Search Report, PCT/US 01/48337, mailed Aug. 20, 2002.

* cited by examiner

Primary Examiner—David A. Zarneke
Assistant Examiner—Jeremy Norris
(74) Attorney, Agent, or Firm—Meyertons Hood Kivlin Kowert & Goetzel, P.C.; B. Noël Kivlin

(57) ABSTRACT

A system and method for distributing power to an integrated circuit. In one embodiment, a power laminate may be mounted to a printed circuit board (PCB). The integrated circuit for which power is to be distributed may be electrically coupled to the PCB. The power laminate may include one or more power planes and one or more reference (i.e. ground) planes, with each pair of power/reference planes separated by a dielectric layer. The power laminate may also include a connector or other means for receiving power from an external power source. The power laminate may be electrically coupled to the integrated circuit, thereby enabling it to provide power to the integrated circuit. The PCB may include a signal layer for conveying signals to and from the integrated circuit, but does not include any means for providing core power to the integrated circuit. Thus, all core power provided to the integrated circuit may be supplied by the power laminate.

22 Claims, 7 Drawing Sheets

METHOD AND APPARATUS FOR DISTRIBUTING POWER TO INTEGRATED CIRCUITS

PRIORITY DATA

This application claims priority to U.S. provisional application Ser. No. 60/244,397, entitled "Method and Apparatus for Distributing Power to Integrated Circuits" filed Oct. 30, 2000.

BACKGROUND OF THE INVENTION

1. Field of the Invention

This invention relates to electronic circuits, and more particularly, to the distribution of power to electronic circuits.

2. Description of the Relevant Art

With each new generation of computer systems, performance demands increase. One such demand relates to power distribution systems, which are required to supply increasing currents at lower voltages and lower impedances. These demands make design of a power distribution system increasingly difficult.

In many computer systems, processors and application specific integrated circuits (ASICs) are the chief consumers of power. Power is typically delivered to these components through a printed circuit board (PCB). Power distribution to a processor or ASIC can consume a significant portion of PCB resources, and is but one of several competing demands which must be considered during the PCB's design. Other demands include signal distribution and routing, component mounting, connector mounting, and so on. These demands are often times in conflict with one another, and thus compromises must be made to the design of the PCB. Such compromises may result in a less than optimal solution in addressing some or all of these demands.

Power distribution on a PCB typically involves at least one pair of copper planes (a power plane and a ground plane), along with a number of decoupling capacitors, typically mounted on a surface of the PCB. Since the PCB must also accommodate signal traces for a number of signals, the copper planes are often times perforated by holes known as vias. The presence of these signal vias may have a tendency to increase the inductance of the copper planes, which in turn results in an increase in impedance. Inductive impedance can be expressed by the formula $Z=2\pi fL$, wherein Z is the impedance, f is the frequency, and L is the inductance. Thus, the impedance of the power distribution system may be affected in large part by both the number of signal vias, as well as the frequency at which the computer system is designed to operate.

Further compounding problems of power distribution on a PCB is the fact that many computer systems required different voltages for various components. This may increase the number of copper planes needed for power distribution, as each voltage may require a separate power plane, and often times will have a separate ground plane as well. This may further increase the number of vias necessary in the PCB, thereby increasing the inductance of each of the power planes.

SUMMARY OF THE INVENTION

The problems outlined above may be solved in large part by a system and method for distributing power to an integrated circuit. In one embodiment, a power laminate may be mounted to a printed circuit board (PCB). The integrated circuit for which power is to be distributed may be electrically coupled to the PCB. The power laminate may include one or more power planes and one or more reference (i.e. ground) planes, with each pair of power/reference planes separated by a dielectric layer. The power laminate may also include a connector or other means for receiving power from an external power source. The power laminate may be electrically coupled to the integrated circuit, thereby enabling it to provide core power to the integrated circuit. The PCB may include a signal layer for conveying signals to and from the integrated circuit, but does not include any means for directly providing core power to the integrated circuit. Thus, all core power provided to the integrated circuit may be supplied by the power laminate. As used herein, the term "core power" refers to that power having a specific voltage and a specific current that is supplied to the integrated circuit itself. For example, one embodiment of an integrated circuit may require a core power having a voltage of 1.2 volts and a maximum current of 20 amperes.

The PCB may be configured for providing power to other components mounted upon it. In one embodiment, the integrated circuit may require power at a low voltage, such as 1.2 volts, for high-frequency operation, while other components mounted upon the PCB which operate at a lower frequency may be configured to receive power with a higher voltage, such as 5 volts.

In one embodiment, a power laminate may be mounted on the bottom of a PCB, with the integrated circuit mounted on top. The power laminate and the integrated circuit may be attached to the PCB by soldering, and one or both may include an array of solder balls known as a ball-grid array. Alternatively, the power laminate may include a land-grid array, in lieu of a BGA, for mounting it to the PCB.

In another embodiment, the power laminate may be arranged between the integrated circuit and the PCB. The power laminate may have at least one aperture to allow the passage of signals between the PCB and the integrated circuit.

In some embodiments, the power laminate may include a plurality of decoupling capacitors. In one embodiment, the decoupling capacitors may be surface mounted to the power laminate.

Thus, in various embodiments, the system for distributing power to an integrated circuit including a power laminate may provide various advantages. By distributing power to the integrated circuit using a power laminate, a PCB may be optimized for signal distribution and routing, while the power laminate is optimized for core power distribution. Compromises to both core power distribution and signal distribution that occur when both are implemented on the PCB may be avoided. Furthermore, distribution of core power by a power laminate may result in a power connection with lower inductance than can be achieved by distributing core power on the PCB. This low-inductance power connection may result in a significant lowering of impedance in the power distribution system. With a low impedance core power connection, power may flow more easily from the power distribution system to the integrated circuit.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Figure 1:
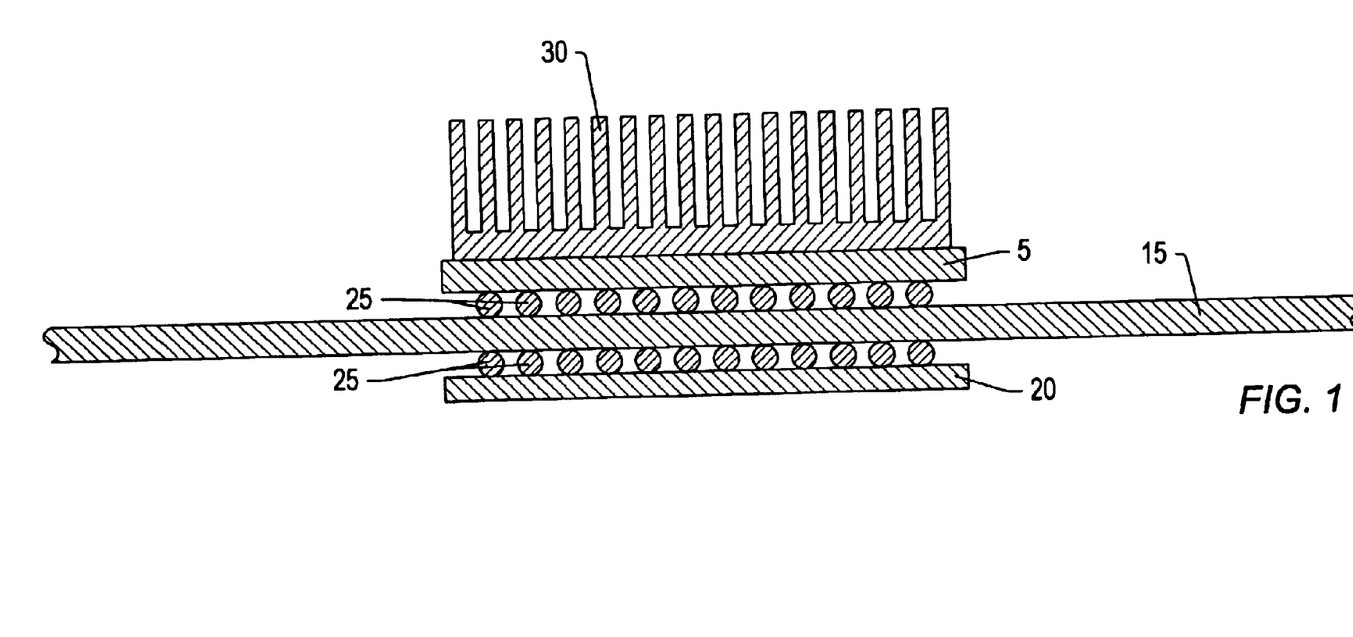
FIG. 1 is a drawing illustrating one embodiment of a power distribution system, including a power laminate, for an integrated circuit.

Turning now to FIG. 1, a drawing illustrating one embodiment of a power distribution system, including a power laminate, for an integrated circuit is shown. Integrated circuit 5 is mounted to printed circuit board (PCB) 15 by solder balls 25, which are part of a ball-grid array (BGA). Heat sink 30 may be mounted upon integrated circuit 5 for the purposes of dissipating heat.

Power laminate 20 may be mounted to PCB 15 on the opposite side of integrated circuit 5, also by a BGA. Power laminate 20 may be configured for the distribution of all power to integrated circuit 5. Power laminate 20 may include at least one power plane and one reference (e.g. ground) plane. In the embodiment shown, PCB 15 does not necessarily include power or ground planes for providing core power to the integrated circuit, although PCB 15 may include power and ground planes for providing power to other components. Providing core power through power laminate 20 may allow PCB 15 to be optimized for signal distribution, while power laminate 20 is optimized for power distribution. PCB 15 may include one or more signal layers, each with a plurality of signal traces, for conveying signals to and from integrated circuit 5.

As used herein, the term "core power" may refer to power having a specific voltage and specific current to be provided to integrated circuit 5, and which may be different from power provided to other components mounted upon PCB 15. For example, integrated circuit 5 may require a core power of 1.2 volts at a maximum of 20 amperes of current, while other components mounted on PCB 15 may require 5-volt power.

A connector or other connecting means for connecting an external power source to power laminate 20 may be present in various embodiments. In various embodiments, the connecting means may be virtually any type of connector that may be mounted to power laminate 20. In another embodiment, power laminate 20 may include pads for soldering wires from an external power source to both the power and reference planes of power laminate 20. The particular means for connecting an external power source to power laminate 20 may be chosen to best suit the particular implementation of the power distribution system. Power for components other than integrated circuit 5 may be delivered through PCB 15 or other appropriate means.

Figure 2:
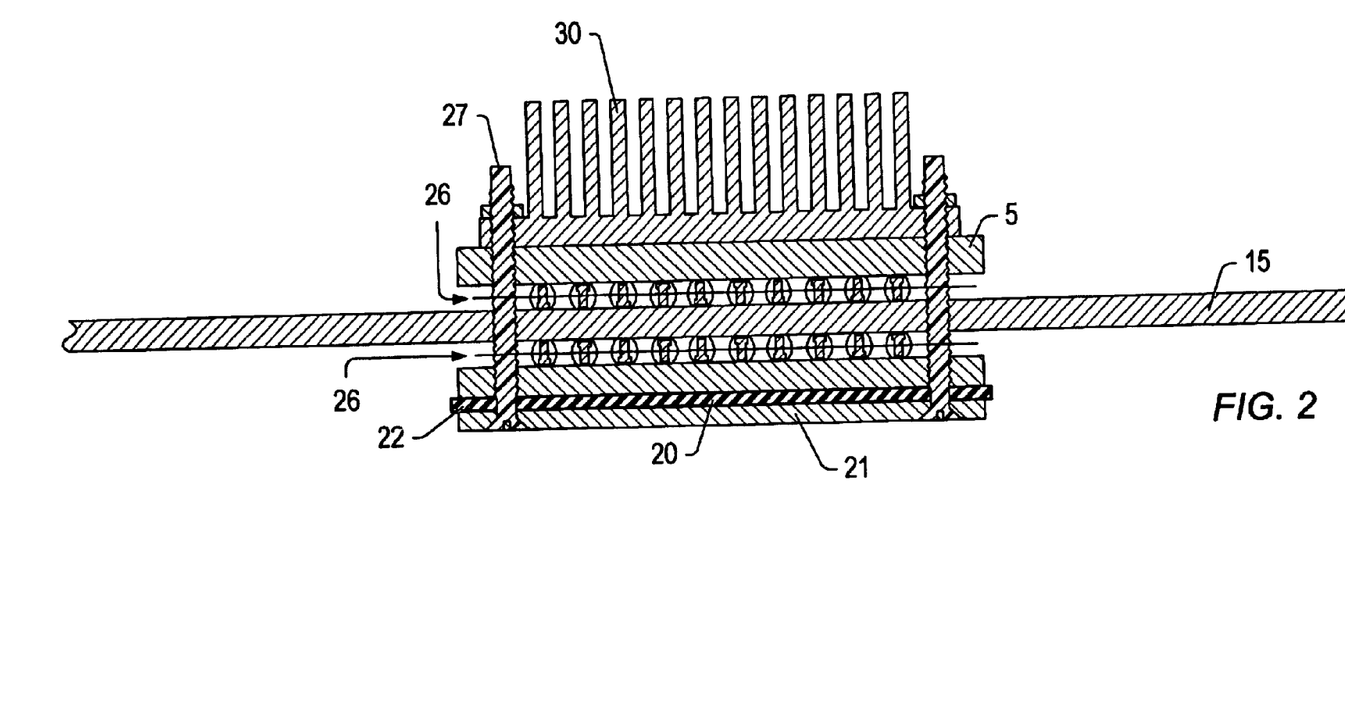
FIG. 2 is a drawing illustrating an embodiment of a power distribution system, including a power laminate and a bolster plate.

Moving now to FIG. 2, a drawing illustrating an embodiment of a power distribution system, including a power laminate and a bolster plate. In the embodiment shown, both integrated circuit 5 and power laminate 20 are each mounted to PCB 15 by land-grid arrays (LGA) 26. The use of LGA 26 instead of a BGA or other type of solder connection may be useful in embodiments in which a large amount of heat is generated by integrated circuit 5.

In the embodiment shown, bolster plate 21 is mounted directly beneath power laminate 20. Bolster plate 21 may include insulator 22 for electrical and/or electromagnetic isolation from power laminate 20. Fasteners 27 may be used to secure bolster plate 21 to power laminate 20, as well as securing heat sink 30 to integrated circuit 5. Bolster plate 21 may provide protection to the assembly shown during handling (e.g. installing the assembly in a computer system chassis). Bolster plate 21 may provide structural stability to power laminate 20, which, in some embodiments, may be a flexible structure.

Figure 3:
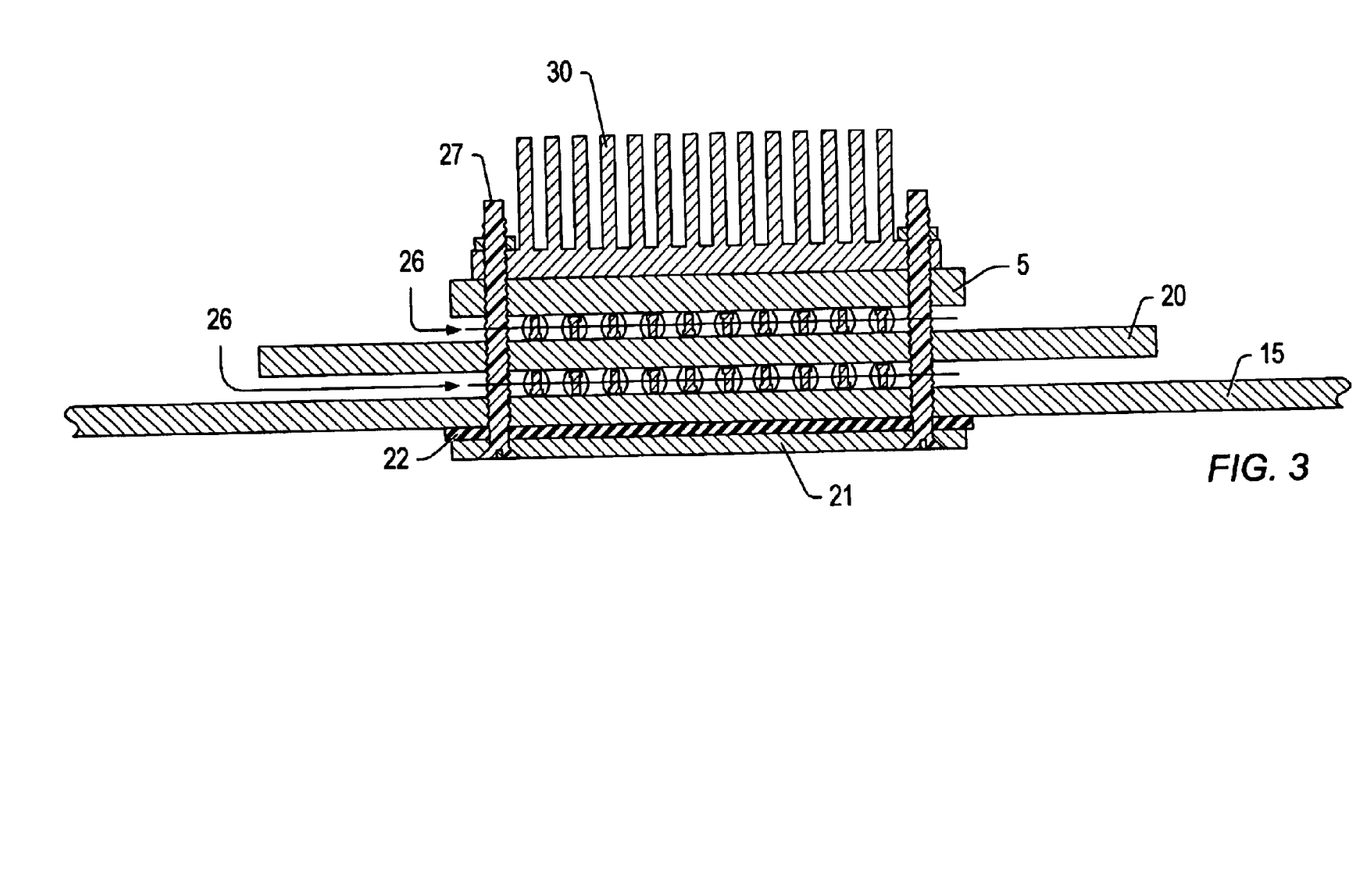
FIG. 3 is a drawing illustrating an embodiment of a power distribution system for an integrated circuit including a power laminate arranged between the integrated circuit and a printed circuit board.

Turning now to FIG. 3, a drawing illustrating an embodiment of a power distribution system for an integrated circuit including a power laminate arranged between the integrated circuit and a printed circuit board. In the embodiment shown, power laminate 20 is mounted to PCB 15 by a LGA 26. Similarly, integrated circuit 5 is mounted to power laminate 20 by a second LGA 26. Power laminate 20, in the embodiment shown, may include one or more apertures to allow for signal paths between PCB 15 and integrated circuit 5. In one embodiment, power laminate 20 may include a single aperture that may be centrally located, allowing for signals to pass between integrated circuit 5 and PCB 15. In another embodiment, power laminate 20 may include multiple pairs of power and reference planes, enabling signals between the pairs of planes, as will be discussed in further detail below.

Figure 4:
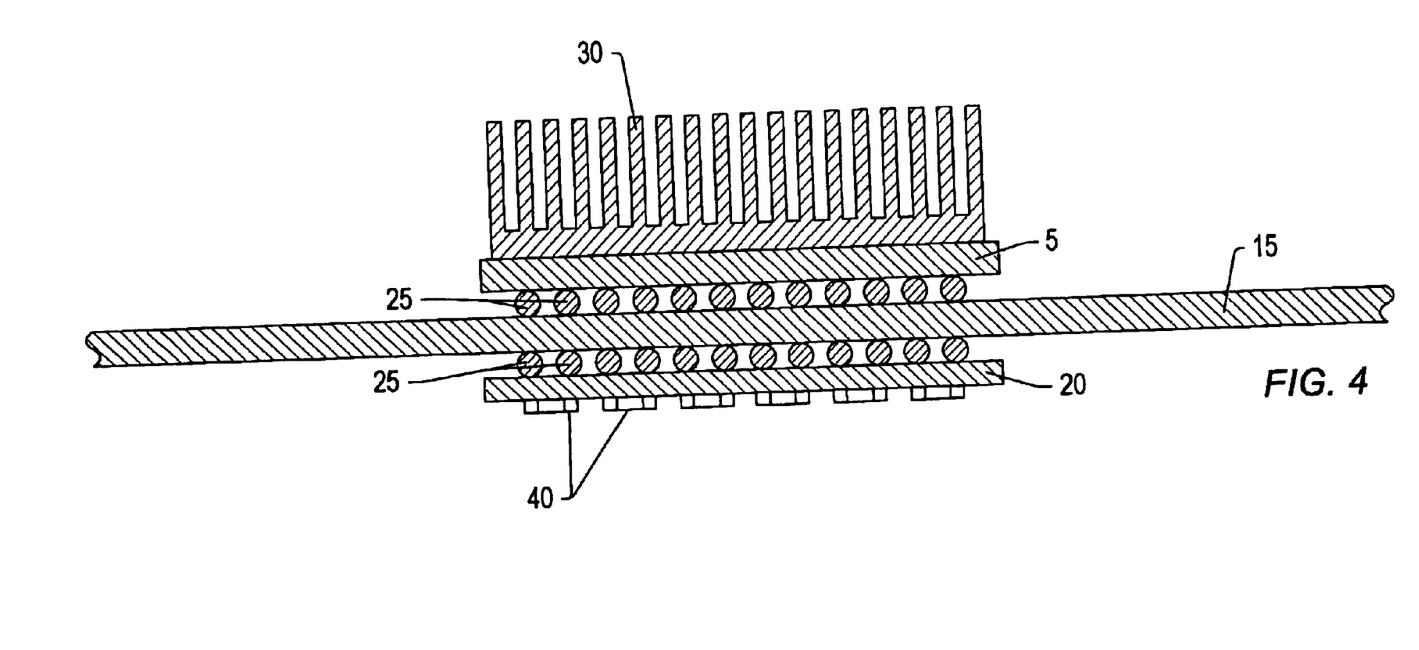
FIG. 4 is a drawing illustrating an embodiment of a power distribution system for an integrated circuit including a power laminate with decoupling capacitors.

FIG. 4 is a drawing illustrating an embodiment of a power distribution system for an integrated circuit including a power laminate with decoupling capacitors. In the embodiment shown, power laminate 20 includes a plurality of decoupling capacitors 40. In the embodiment shown, decoupling capacitors 40 may be surface mounted capacitors, and may be used to provide additional decoupling capacitance for the power distribution system. In some embodiments, such as those illustrated in FIGS. 1, 2, and 3, decoupling capacitors may not be necessary, as the capacitance provided by the power laminate may be sufficient.

Figure 5:
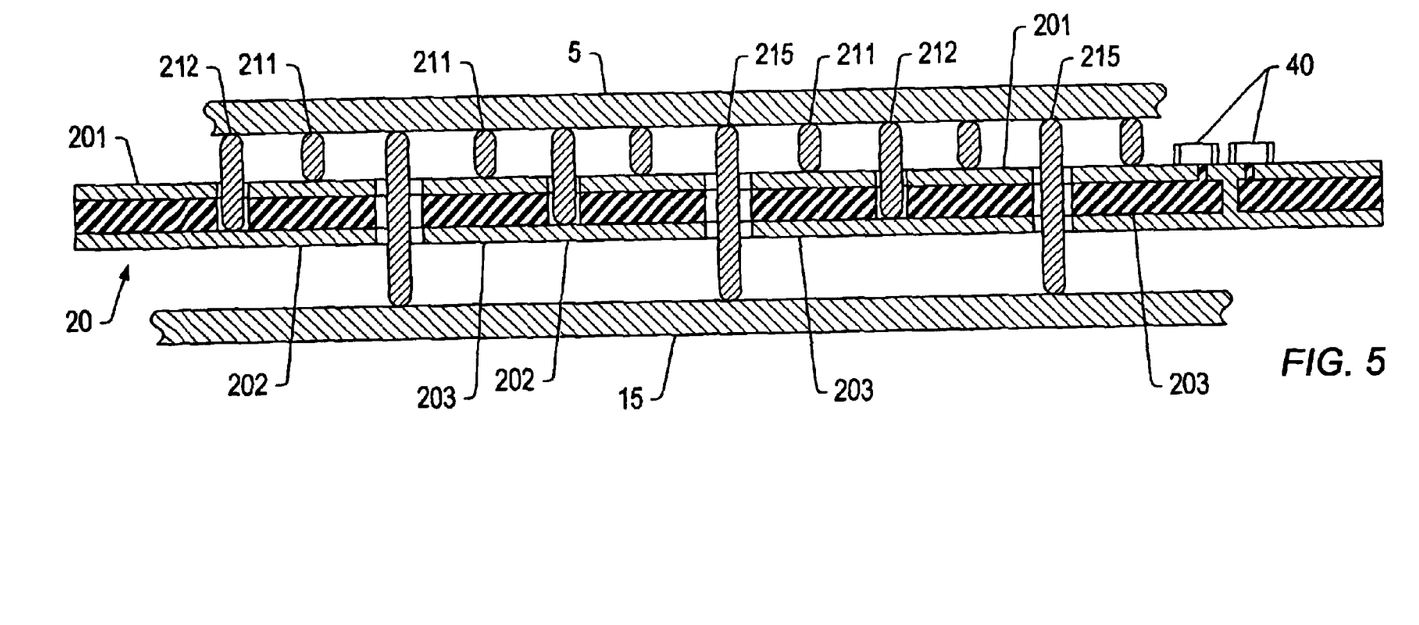
FIG. 5 is a drawing illustrating a cutaway view of a power distribution system including one embodiment of a power laminate, wherein the power laminate is arranged between an integrated circuit and a printed circuit board.

Turning now to FIG. 5, a drawing illustrating the basic structure of one embodiment of a power laminate is shown. In the embodiment shown, power laminate 20 is shown in a cutaway view, and is arranged between integrated circuit 5 and PCB 15. Power laminate 20 includes a power plane 201 and a reference plane 202, separated by dielectric layer 203. Dielectric layer 203 may be made of any dielectric material, and its thickness may vary according to the needs for the particular implementation. Power plane 201 and reference plane 202 may be constructed of a conductive material, such as copper or other metals with electrically conductive properties.

In the embodiment shown, both power plane 201 and reference plane 202 include a plurality of apertures to allow signals to pass from integrated circuit 5 to PCB 15. Power plane 201 may include additional apertures to allow for the connection of reference plane 202 to integrated circuit 5. Signal connections 215 may be arranged to allow the passage of signals between integrated circuit 5 and PCB 15. Power connections 211 may connect directly from power plane 201 to integrated circuit 5, thereby providing it with power. Ground connections 212 may connect reference plane 202 to integrated circuit 5, thereby providing a current return path.

Capacitors 40 may also be included in various embodiments of power laminate 20. In the embodiment shown, capacitors 40 are surface-mounted capacitors mounted to one side of power laminate 20. Various types of capacitor packages may be used, and capacitors 40 may be mounted upon either side of the power laminate. Capacitors 40 may be used to provide additional decoupling capacitance (over that provided by the power laminate itself) within the power distribution system.

In alternative embodiments, in lieu of apertures, power laminate 20 may include multiple, separate planes for both power plane 201 and reference plane 202. These planes may be arranged in pairs which are in an electrically parallel configuration with each of the other plane pairs. Signal connections may be arranged to pass through spaces between the pairs of planes.

Figure 6:
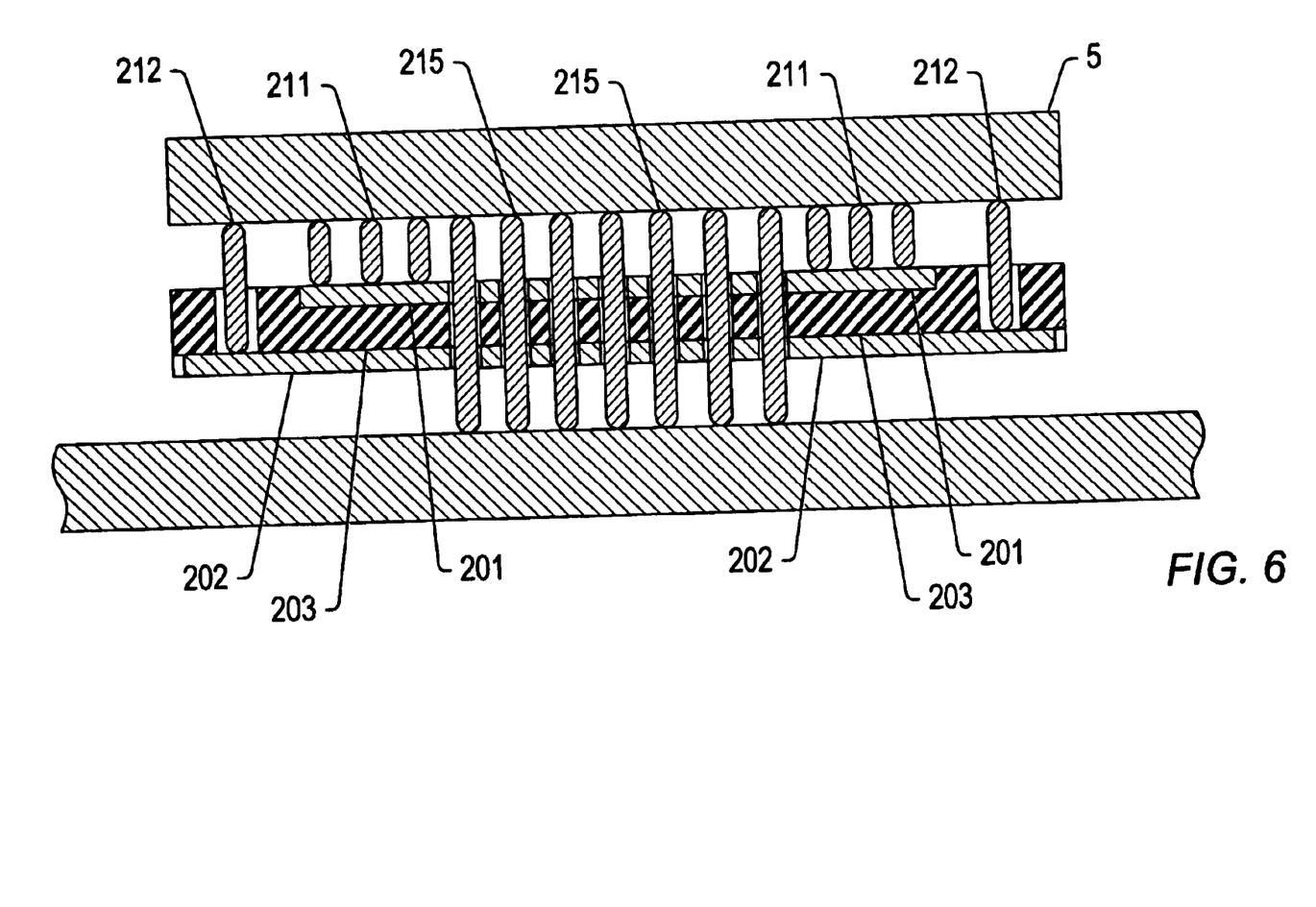
FIG. 6 is a drawing illustrating a cutaway view of a power distribution system including another embodiment of a power laminate, wherein the power laminate is arranged between an integrated circuit and a printed circuit board.

FIG. 6 is a drawing illustrating a cutaway view of a power distribution system including another embodiment of a power laminate, wherein power laminate 20 is arranged between integrated circuit 5 and PCB 15. In the embodiment shown, power laminate 20 includes a large, centrally located aperture in order to allow signals to pass between integrated circuit 5 and PCB 15. The signals may be conveyed between integrated circuit 5 and PCB 15 by signal connections 215, which pass through the aperture in power laminate 20. Power plane 201 may be electrically connected to integrated circuit 5 by power connections 211, thereby providing it with power.

In the embodiment shown, the width of reference plane 202 are slightly larger than the dimensions of power plane 201. In this embodiment, reference plane 202 may be connected to integrated circuit 5 by ground connections 212. Ground connections 212 may be arranged along the periphery of reference plane 202. This may allow reference plane 202 to be coupled to integrated circuit 5 without the need for additional apertures in power plane 201 (although apertures in dielectric layer 203 may be present). Apertures in the planes may give rise to inductance within the planes, which in turn may increase the impedance of the power distribution system. By extending the dimensions of reference plane 202 to allow it to be connected to integrated circuit 5 without the need for more apertures in power plane 201, additional inductance may be avoided. Other embodiments, wherein the arrangement of power plane 201 and reference plane 202 are reversed (i.e. power plane 201 having extended dimension with power connectors 211 arranged on the periphery) are possible and contemplated.

Figure 7:
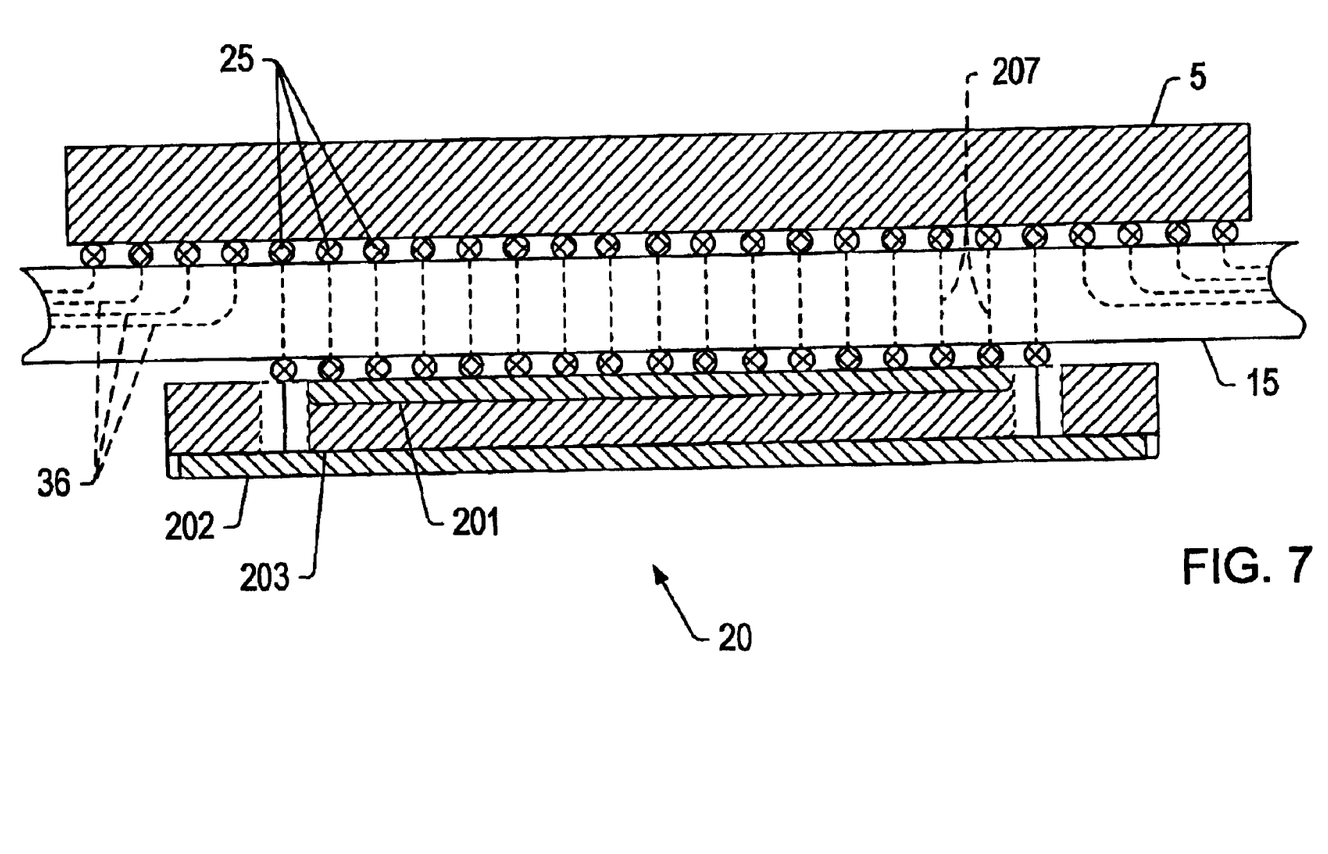
FIG. 7 is a drawing illustrating a cutaway view of a power distribution system including an embodiment of a power laminate mounted to a printed circuit board, with an integrated circuit mounted upon the opposite side of the printed circuit board.

FIG. 7 is a drawing illustrating a cutaway view of a power distribution system including an embodiment of power laminate 20 mounted to a PCB 15, with integrated circuit 5 mounted upon the opposite side of PCB 15. In the embodiment shown, both power laminate 20 and integrated circuit 5 are mounted to PCB 15 by solder balls 25. Solder balls 25 connecting power laminate 20 to PCB 15 may be part of a ball-grid array. Similarly, solder balls 25 connecting integrated circuit 5 to PCB 15 may also be part of a ball-grid array.

Both power plane 201 and reference plane 202 may be connected to integrated circuit 5 by conductors 207, which pass through PCB 15. In one embodiment, conductors 207 are terminated at solder pads configured for accommodating solder balls on both the top and bottom of PCB 15.

In the embodiment shown, power plane 201 may be free of apertures, which may be required in other embodiments to allow for connections for signals and connections to the reference plane. In this embodiment, connections for power plane 201 may be centrally located on power laminate 20 and integrated circuit 5. Reference plane 202 may have a larger width (or length) than power plane 202, and thus, connections to PCB 15 may be arranged closer to the peripheral of power laminate 20 than those connections for power plane 201. This may help in eliminating the need for apertures in power plane 201. The elimination of apertures in power plane 201 and/or reference plane 202 may result in lower inductance (and thus, lower impedance) in the power distribution system.

It should be noted that embodiments wherein the arrangement of power plane 201 and reference plane 202 is the opposite as shown (i.e. reference plane 202 on top and nearer to PCB 15 than power plane 201) are possible and contemplated.

PCB 15 may include a plurality of signal traces 36 for conveying signals to and from integrated circuit 5. The signals may be conveyed from PCB 15 to integrated circuit 5 through LGA 26. Signal connections on integrated circuit 5 may be arranged towards the peripheries of the integrated circuit package. This arrangement of signal connections from integrated circuit 5 to the signal traces 36 of PCB 15 may allow for unobstructed electrical paths (i.e. conductors 207) from both power plane 201 and reference plane 202 to integrated circuit 5. This may in turn allow for greater optimization of PCB 15 for conveying signals, as well as greater optimization of power laminate 20 for power distribution.

The various arrangements of the power laminate (with respect to the PCB and the integrated circuit) shown above each provide certain advantages and disadvantages. Embodiments where the power laminate is arranged between the PCB and integrated circuit may result in a significant savings of circuit board area, as the area on the PCB opposite the integrated is not used for mounting the power laminate. However, such embodiments may require apertures to allow for signals to pass between the integrated circuit and the PCB. This may result in a greater inductance associated with power laminate (as opposed to embodiments wherein there are no apertures in the power and/or reference planes), and thus the impedance of the power distribution system. However, the inductance (and thus impedance) of such an embodiment may be significantly lower than if the power and reference planes are located within the PCB itself.

Embodiments such as that shown in FIG. 7, wherein the power laminate is mounted on the opposite side of the PCB from the integrated circuit may have a very low inductance. This may be true in large part due to the fact that neither the power or reference planes have any apertures. However, embodiments such as this may require the product form factor to be considered, as the power laminate is mounted on the opposite side of the integrated circuit.

In various embodiments, two main types of inductance may be associated with the power laminate (or power distribution systems in general). Horizontal inductance may be primarily associated with a plane pair, such as a pair of copper planes used as power and reference planes. Vertical inductance may primarily be associated with connections to the integrated circuit, or connections from the power laminate to the PCB (e.g. solder balls). Horizontal inductance may be 3–4 times greater than the vertical inductance, and possibly greater when apertures such as signal vias are factored in. By moving power distribution off of a PCB and onto a power laminate, a significant amount of this inductance may be eliminated, resulting in a power distribution system with lower impedance.

Horizontal inductance may be minimized in various ways. Eliminating or minimizing the number of apertures in a power plane (or reference plane) may keep the horizontal inductance at a minimum. In some embodiments where signals must pass through the power laminate, inductance may be minimized by the use of multiple power and/or reference planes. In one embodiment, both the power and reference plane may be divided into multiple pairs of planes, with each pair in an electrically parallel configuration with respect to the other pairs. This may be an effective way to minimize the inductance associated with these types of embodiments. For example, an embodiment with 3 pairs of power/reference planes placed in parallel with each other may have an inductance that is ⅓ of the value of an embodiment using a single power/reference plane pair. Using a very thin dielectric between a power plane and an associated ground plane may also be an effective method of reducing horizontal inductance.

Vertical inductance may be minimized by using more vertical structures in order to mount the power laminate. An example of a vertical structure would be the solder balls of a BGA, as shown in various embodiments above, or the connections associated with an LGA. Since the power laminate is separate from the PCB, and thus must be mounted to it, a large number of vertical structures may be used, thereby minimizing vertical inductance.

By reducing both horizontal and vertical inductance, the overall impedance of a power distribution system for an integrated circuit may be greatly reduced. In one embodiment, a power distribution system including a power laminate may be as low as 10 Pico-henries (pH).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system comprising:
    an integrated circuit;
    a printed circuit board (PCB) including at least one signal layer for conveying signals to and from the integrated circuit, wherein the PCB excludes any power planes coupled to provide core power to the integrated circuit; and
    a power laminate separate from the PCB, wherein the power laminate includes at least one power plane and at least one reference plane coupled to provide core power to the integrated circuit,
    wherein the power laminate excludes any signal layers coupled to convey signals to and from the integrated circuit, and wherein the power laminate includes a connector for coupling a power source to the power laminate.

2. The system as recited in claim 1, wherein the integrated circuit is mounted upon a first side of the PCB, and wherein the power laminate is mounted upon a second side of the PCB.

3. The system as recited in claim 1, wherein the power laminate is arranged between the integrated circuit and the PCB.

4. The system as recited in claim 3, wherein the power laminate includes at least one aperture for allowing signals to pass from the PCB to the integrated circuit.

5. The system as recited in claim 1, wherein the power laminate is mounted to the PCB by soldering.

6. The system as recited in claim 5, wherein the power laminate includes a ball-grid array.

7. The system as recited in claim 1, wherein the power laminate includes a land-grid array for mounting the power laminate to the PCB.

8. The system as recited in claim 1, wherein the power laminate includes a dielectric layer arranged between the power plane and the reference plane.

9. The system as recited in claim 1, wherein the power laminate includes two or more plane pairs, wherein each of the plane pairs includes a power plane and a reference plane.

10. The system as recited in claim 9, wherein a first of the two or more plane pairs is in an electrically parallel configuration with respect to a second of the two or more plane pairs.

11. A method for delivering power to an integrated circuit, the method comprising:
    providing an integrated circuit;
    providing a printed circuit board (PCB) including at least one signal layer for conveying signals to and from the integrated circuit, wherein the PCB excludes any power planes coupled to provide core power to the integrated circuit; and
    providing a power laminate separate from the PCB, wherein the power laminate includes at least one power plane and one reference plane coupled to provide core power to the integrated circuit;
    wherein the power laminate excludes any signal layers coupled to convey signals to and from the integrated circuit, and wherein the vower plane laminate includes a connector for coupling a power source to the power laminate.

12. The method as recited in claim 11 further comprising mounting the integrated circuit upon a first side of the PCB and mounting the power laminate on a second side of the PCB.

13. The method as recited in claim 11 further comprising arranging the power laminate between the integrated circuit and the PCB.

14. The method as recited in claim 13 further comprising providing at least one aperture in the power laminate for allowing signals to pass from the PCB to the integrated circuit.

15. The method as recited in claim 11 further comprising mounting the power laminate to the PCB by soldering.

16. The method as recited in claim 15, wherein the power laminate includes a ball-grid array.

17. The method as recited in claim as recited in claim 11, wherein the power laminate includes a land-grid array for mounting the power laminate to the PCB.

18. The method as recited in claim 11, wherein the power laminate includes a dielectric layer arranged between the power plane and the reference plane.

19. The method as recited in claim 11, wherein the power laminate includes a two or more plane pairs, wherein each of the plane pairs includes a power plane and a reference plane.

20. The method as recited in claim 19, wherein a first of the two or more plane pairs is in an electrically parallel configuration with respect to a second of the two or more plane pairs.

21. A system comprising:
   an integrated circuit;
   a printed circuit board (PCB) including at least one signal layer for conveying signals to and from the integrated circuit, wherein the PCB excludes any power planes coupled to provide core power to the integrated circuit; and
   a power laminate separate from the PCB, wherein the power laminate includes at least one power plane and at least one reference plane coupled to provide core power to the integrated circuit, wherein the power laminate excludes any signal layers coupled to convey signals to and from the integrated circuit, wherein the integrated circuit is mounted upon a first side of the PCB, and wherein the power laminate is mounted upon a second side of the PCB.

22. A method for delivering power to an integrated circuit, the method comprising:
   providing an integrated circuit;
   providing a printed circuit board (PCB) including at least one signal layer for conveying signals to and from the integrated circuit, wherein the PCB excludes any power planes coupled to provide core power to the integrated circuit; and
   providing a power laminate separate from the PCB, wherein the power laminate includes at least one power plane and one reference plane coupled to provide core power to the integrated circuit; and
   mounting the integrated circuit upon a first side of the PCB and mounting the power laminate on a second side of the PCB;
   wherein the power laminate excludes any signal layers coupled to convey signals to and from the integrated circuit.

* * * * *

UNITED STATES PATENT AND TRADEMARK OFFICE
CERTIFICATE OF CORRECTION

PATENT NO. : 6,794,581 B2
DATED : September 21, 2004
INVENTOR(S) : Smith et al.

It is certified that error appears in the above-identified patent and that said Letters Patent is hereby corrected as shown below:

<u>Column 8,</u>
Line 49, please delete "the vower plane" and substitute -- the power plane --.

Signed and Sealed this

First Day of February, 2005

JON W. DUDAS
*Director of the United States Patent and Trademark Office*